(12) United States Patent
Fasshauer

(10) Patent No.: US 8,823,676 B2
(45) Date of Patent: Sep. 2, 2014

(54) TOUCH-DETECTION SYSTEM FOR DISPLAY

(75) Inventor: Peter Fasshauer, Neubiberg (DE)

(73) Assignee: Ident Technology AG, Wessling (DE)

( * ) Notice: Subject to any disclaimer, the term of this patent is extended or adjusted under 35 U.S.C. 154(b) by 158 days.

(21) Appl. No.: 12/743,729

(22) PCT Filed: Jan. 21, 2010

(86) PCT No.: PCT/EP2010/000350
§ 371 (c)(1),
(2), (4) Date: Dec. 9, 2010

(87) PCT Pub. No.: WO2010/084004
PCT Pub. Date: Jul. 29, 2010

(65) Prior Publication Data
US 2011/0267302 A1    Nov. 3, 2011

(30) Foreign Application Priority Data

Jan. 21, 2009  (DE) .......................... 10 2009 005 567
Jan. 22, 2009  (DE) .......................... 10 2009 005 611

(51) Int. Cl.
*G06F 3/045* (2006.01)
(52) U.S. Cl.
USPC .......................... 345/174; 345/173; 178/18.01
(58) Field of Classification Search
USPC .................... 345/173–179; 178/18.01–18.04
See application file for complete search history.

(56) References Cited

U.S. PATENT DOCUMENTS

| 4,581,483 | A * | 4/1986 | Ralston ..................... 178/20.01 |
| 5,861,875 | A * | 1/1999 | Gerpheide .................... 345/174 |
| 6,400,359 | B1 * | 6/2002 | Katabami .................... 345/173 |
| 7,969,166 | B2 | 6/2011 | Fasshauer ..................... 324/663 |
| 8,274,481 | B2 * | 9/2012 | Nishimura et al. ........... 345/173 |
| 2006/0012944 | A1 | 1/2006 | Mamigonians |
| 2007/0040810 | A1 | 2/2007 | Dowe et al. |
| 2009/0219039 | A1 | 9/2009 | Fasshauer |
| 2010/0024573 | A1 * | 2/2010 | Daverman et al. ....... 73/862.626 |

FOREIGN PATENT DOCUMENTS

| DE | 102006051184 A1 | 5/2007 | ............... G01V 3/12 |
| GB | 2394775 A | 5/2004 | ........... H03K 17/955 |
| WO | 2007/022259 A2 | 2/2007 | .............. G06F 3/041 |
| WO | 2007/048640 A1 | 5/2007 | ........... H03K 17/955 |

OTHER PUBLICATIONS

International Search Report and Written Opinion, Application No. PCT/EP2010/000350, 9 pages, Aug. 20, 2010.

* cited by examiner

*Primary Examiner* — Kimnhung Nguyen
(74) *Attorney, Agent, or Firm* — King & Spalding L.L.P.

(57) ABSTRACT

A display screen is carried on a base by an elastically deformable support such that a touch shifts the screen relative to the base. A pair of juxtaposed electrodes form a capacitor, with one of the electrodes fixed to the screen and the other of the electrodes fixed to or formed by the base. A capacitance of the capacitor changes when the screen electrode moves relative to the base electrode. A circuit connected to the electrodes initiates an action on change of the capacitance.

10 Claims, 2 Drawing Sheets

TOUCH-DETECTION SYSTEM FOR DISPLAY

CROSS REFERENCE TO RELATED APPLICATIONS

This application is the US national phase of PCT application PCT/EP2010/000350, filed 21 Jan. 2010 and claiming the priority of German patent application 102009005567.3 itself filed 21 Jan. 2009 and German patent application 102009005611.4 itself filed 22 Jan. 2009, whose entire disclosures are herewith incorporated by reference.

The present invention concerns a system that can detect a soft touch on a screen, display or other screen element by a finger or pen in order to activate further functions, like an initialization for a cursor control.

The object of the invention is to allow the detection of contact with the above-described structures in an improved way compared to former solutions.

This object is attained according to the invention by a display having:
  a screen panel,
  an electrode assembly,
  a support carrying the screen panel such that it is moved by a compression force exerted by contact with the screen panel, the electrode assembly being coupled with the screen panel and forming part of a capacitor whose capacitance changes when the support is subjected to a load.

In this way it is possible in an advantageous way, by subjecting the support to a load and by the consequential small position change of the screen structure, to detect if it is touched and, by means of the corresponding detection event, to start further circuit processes, for example a wakeup mode of an electronic device. The solution according to the invention is suitable especially for use in mobile phones, PDAs, portable input devices, remote controls and especially also gaming computers.

Preferably the screen panel is rectangular. The electrode is preferably in a corner of the screen panel. The electrode is preferably flat, for example a metallic coating.

BRIEF DESCRIPTION OF THE FIGURES

Further particulars and characteristics of the invention are seen in the following description with reference to the drawing. Therein:

FIG. 1b is a sectional view further illustrating the display according to FIG. 1a;

DETAILED DESCRIPTION OF THE INVENTION WITH REFERENCE TO THE FIGURES

The concept according to the invention for detecting contact with a display is based on capacitive technology that is described more in detail in the following.

Figure 1A:
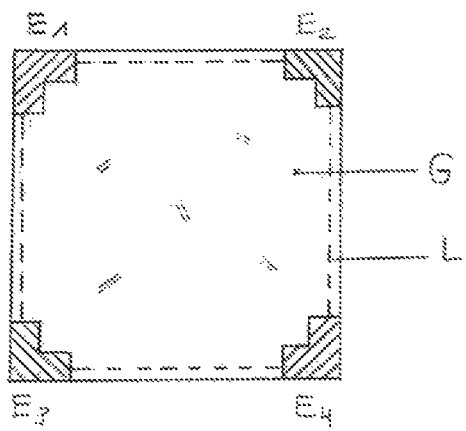
FIG. 1a is a first view showing the display equipped according to the invention.

The fundamental idea consists in detecting a soft touch of the screen of the display by means of a capacitance change by mounting according to FIG. 1a on the glass sheet G strip electrodes E1 to E4, either wholly or partially e.g. in four corners on or under the screen and connected by thin conductive traces, so that there is effectively only one electrode running around the periphery of the glass sheet.

This electrode system can also be made by applying a conductive structure to the screen. The embodiment of the electrodes according to FIG. 1a has the advantage that only a small part of the glass surface is covered with electrode material and in this way the remaining part of the screen periphery can be used for other systems like piezo sensors for the detecting the position of a finger.

The electrodes form with a metal base frame R provided under the glass sheet a capacitor of capacitance C that is a function both of the total area A of the electrodes and their spacing a, according to $$C = \epsilon A/a \quad (1)$$

Figure 1B:
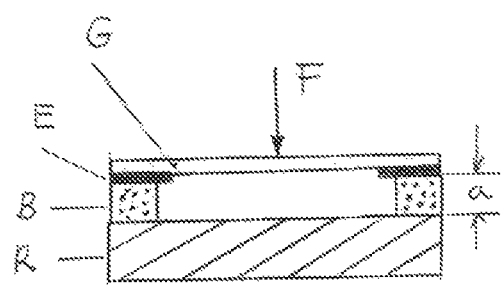

If, as shown in FIG. 1b, the glass sheet including the applied electrode strips is carried on an elastic support B on the metal frame R, in case of contact with a force F a change in the spacing a results and with it from equation 1 a relative capacitance change of $$\Delta C/C = -\Delta a/a \quad (2)$$

The design of the support B can vary, for example it can be metal or plastic springs, rubber profiles of various forms or foam-plastic strips. It is particularly advantageous if the material works in the elastic (Hook's) range defined by a spring constant k, so that in case of application of a force F the relative capacitance change of equation 2 can be indicated as $$\Delta C/C = F/ka \quad (3)$$

The evaluation of the capacitance change $\Delta C$ and thus of a contact with the display glass in the case under consideration is done by a selective capacitive sensor, especially according to the phase process described in PCT/EP2006/01043, preferably in a special variant more closely described in the following.

The selective sensor according to the invention is of particular advantage, because for example in case of use of a display, considerable parasitic signals of an amplitude of several volts are present on the electrodes from the electronics of the device and act on the sensor input and without a sufficient filtration already at the input would prevent reliable measurement of the capacitance change and with it detection of the contact. For these sensors according to the invention a circuit according to the phase process mentioned and described in PCT/EP2006/01043 is used, the inductance necessary for this purpose being replaced by an active disposition, thus avoiding use of a coil with large inductance, and in this way the sensor can be integrated in a compact way into the electronics present in the display. Moreover there is also the possibility of a later integration in an ASIC.

An active element with the function of an inductance is called a gyrator. By the represented network a minimum of electronic components results for the generation of large inductances with high quality factor Q. The represented circuit comprises an operational amplifier as impedance converter. This generally leads to coils with relatively low quality Q. For a high touch sensitivity and thus high accuracy of measurement of capacitance variations preferably higher quality factors are selected for the selected phase process. As illustrated in PCT/EP2006/01043, the resulting phase change $\Delta\Phi$ (=sensor sensitivity) in the environment of the resonance frequency is determined by $$\Delta\Phi = Q\Delta C/C \quad (4)$$

Figure 2A:
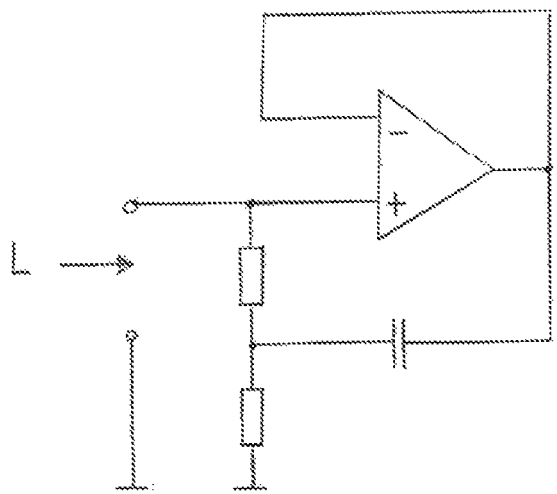
FIG. 2a is a circuit diagram showing a first circuit for generating a detection signal.
Figure 2B:
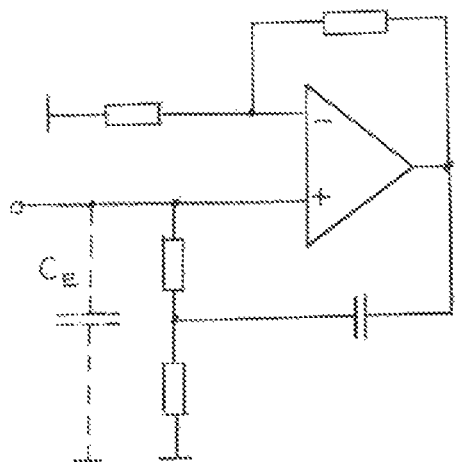
FIG. 2b is a circuit diagram showing a second circuit variant for generating a detection signal.

Thus as the quality factor Q increases, the sensitivity of detection of capacitance variations $\Delta C$ also increases. This is done according to the invention by a modification of the circuit of FIG. 2a, in that the feed-back path of the op-amp has a voltage divider usual for an amplification >1 in the network according to FIG. 2b and in this way a higher tension is fed back on the positive signal input of the op-amp, so the quality factor of the generated inductance rises considerably. The cause of this is that with an amplification of the op-amp greater than 1 the real part of the complex input impedance becomes smaller, which corresponds to a reduction of losses and thus an increase of quality.

The precise dimensioning of the voltage divider and thus of the adjusted amplification depends in each case decisively on the type of the selected operational amplifier. At the input of the circuit of FIG. 2b the inductance is completed by the capacitance $C_E$ of the connected electrode to form a selectively working parallel resonant circuit and thus become the element necessary for the application of the phase process.

Summarizing equation 3 and 4, one finally obtains the correlation between the resulting phase shift and the force F acting on the glass sheet, as $$\Delta\Phi = QF/ka \qquad (5)$$

Equation 5 thus describes the characteristic of a force sensor. In association with the conversion described in DE 10 2006 051 184.0 [US 2009/0219039] of a phase shift into a proportional change of the output voltage u of the sensor, typically sensitivities $\Delta u/F$ of several mV/g arise. This is sufficient to guarantee, in case of light finger pressure on the glass top, a safe detection despite ample parasitic signals due to the electronics of the display.

The benefits of the system according to the invention in view of the present application can be thus summarized:
1. Simple detection of a contact by slight distance variation of a glass sheet resting on elastic material, without need of great changes in the construction of the display.
2. Extension of a functionality present in the display for position detection by means of piezo sensors.
3. Selective capacitive sensor according to the phase process using a modified gyrator circuit, with which a high touch sensitivity with high interference suppression is reached.

The invention claimed is:

1. An arrangement for detecting contact on a display, the arrangement comprising:
a screen panel,
an electrode forming part of a capacitor, and
a support carrying the screen panel and being configured such that it the support structure is compressed by a compression force exerted by contact with the screen panel, the electrode being coupled with the screen panel, the capacitor having a capacitance that changes when the support is compressed,
wherein the support comprises a base and an elastically deformable spacer arranged between the base and the screen panel such that a touch on the screen panel shifts the screen relative to the base;
and wherein the electrode is a first electrode of the capacitor, wherein the first electrode is fixed to the screen panel and a second electrode is fixed to or formed by the base, and
circuit means connected to the first and second electrodes for initiating an action on change of the capacitance.

2. The arrangement according to claim 1, wherein the screen panel is rectangular and the electrode is in a corner of the screen panel.

3. The arrangement according to claim 2, wherein the electrode is flat.

4. The arrangement according to claim 3, wherein the electrode is a metallic layer.

5. The arrangement according to claim 1 wherein a change of the capacitance of the capacitor is detected on the basis of a phase shift.

6. The arrangement according claim 1 wherein the electrode constitutes part of an LC network whose inductance is formed by a gyrator circuit.

7. The arrangement according to claim 1, wherein the screen panel is polygonal and has corners, the first electrode being in at least one of the corners.

8. The arrangement according to claim 7, wherein the first electrode extends annularly around an edge of the screen through all the corners, the second electrode being of generally the same shape as the first electrode.

9. The arrangement according to claim 1, wherein the first electrode is a metallic trace fixed to the screen panel.

10. The arrangement according to claim 1, wherein the circuit means detects a phase shift of the capacitance.

* * * * *